United States Patent
Iacobucci et al.

(10) Patent No.: US 11,817,518 B2
(45) Date of Patent: Nov. 14, 2023

(54) MULTI-JUNCTION PICO-AVALANCHE DETECTOR

(71) Applicant: Université de Genève, Geneva (CH)

(72) Inventors: Giuseppe Iacobucci, Grand-Lancy (CH); Pierpaolo Valerio, Prévessin-Moëns (FR); Lorenzo Paolozzi, Thoiry (FR)

(73) Assignee: UNIVERSITÉ DE GENÈVE, Geneva (CH)

( * ) Notice: Subject to any disclaimer, the term of this patent is extended or adjusted under 35 U.S.C. 154(b) by 304 days.

(21) Appl. No.: 17/295,042

(22) PCT Filed: Nov. 8, 2019

(86) PCT No.: PCT/EP2019/080735
§ 371 (c)(1),
(2) Date: May 19, 2021

(87) PCT Pub. No.: WO2020/104220
PCT Pub. Date: May 28, 2020

(65) Prior Publication Data
US 2021/0280734 A1  Sep. 9, 2021

(30) Foreign Application Priority Data
Nov. 19, 2018  (EP) .................................... 18207008

(51) Int. Cl.
*H01L 31/107*  (2006.01)
*H01L 31/02*  (2006.01)

(52) U.S. Cl.
CPC .... *H01L 31/1075* (2013.01); *H01L 31/02027* (2013.01)

(58) Field of Classification Search
None
See application file for complete search history.

(56) References Cited

U.S. PATENT DOCUMENTS

| | | | |
|---|---|---|---|
| 9,728,667 B1 | 8/2017 | Johnson | |
| 2010/0271108 A1* | 10/2010 | Sanfilippo | ....... H01L 31/022416 257/438 |
| 2020/0020821 A1* | 1/2020 | Mazzillo | ............ H01L 31/0352 |

FOREIGN PATENT DOCUMENTS

WO  2009/103048  8/2009

OTHER PUBLICATIONS

Eric A. G. Webster et al: "An Infra-Red Sensitive, Low Noise, Single-Photon Avalanche Diode in 90nm CMOS", 2011 International Image Sensor Workshop(II 5W), Hokkaido, Japan, Jun. 8, 2011.

* cited by examiner

Primary Examiner — Evren Seven
(74) Attorney, Agent, or Firm — Thomas Coester Intellectual Property

(57) ABSTRACT

The present relates to a multi-junction photon detector comprising a semiconductor substrate, a plurality of n+ pixels on the top surface and a p+ uniform doping implant on the backside and at least one n-doped layer on the backside, deeper in the substrate bulk than the p+ implant, such that the detector presents a first PN junction corresponding to a drift and signal induction region and comprising the pixels on the substrate, and a second PN junction corresponding to a gain region and comprising the n-doped layer disposed on the backside of the detector active area deeper in the substrate bulk. These two junctions are operated in inverse polarization. The area between them contains a PN junction in direct polarization and it is fully depleted from the free charges.

12 Claims, 14 Drawing Sheets

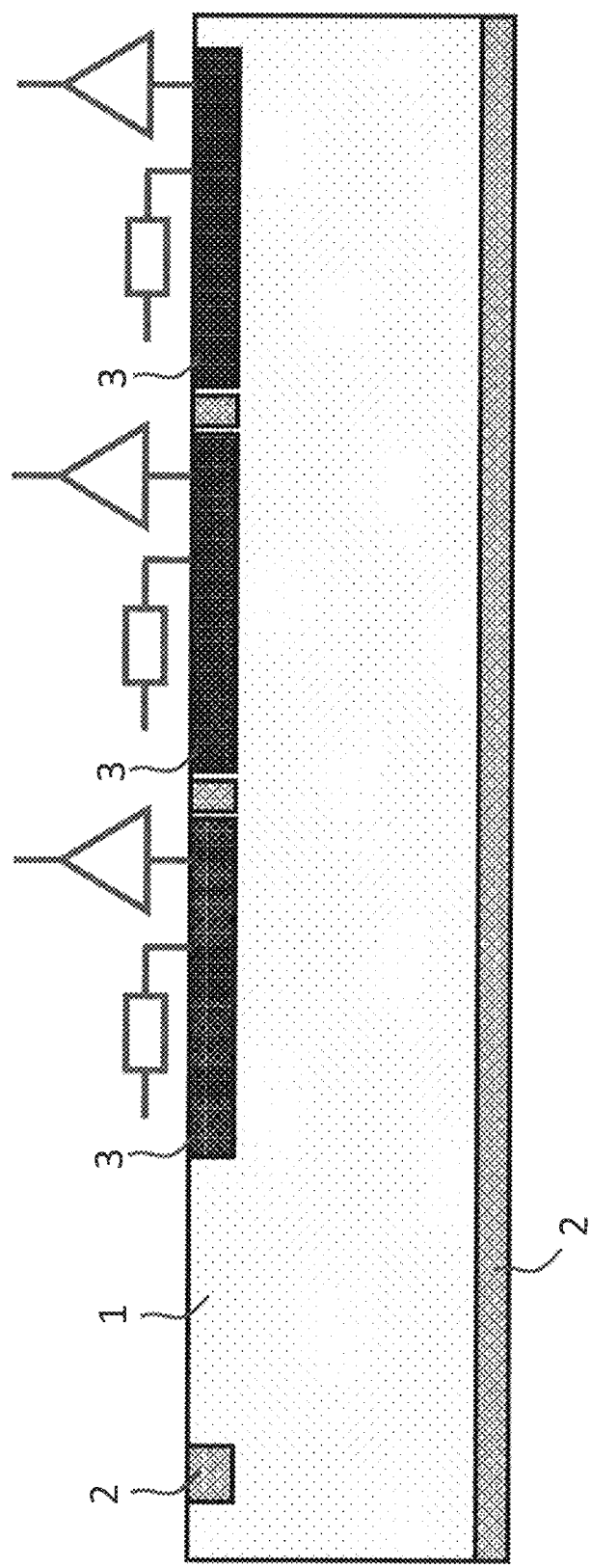

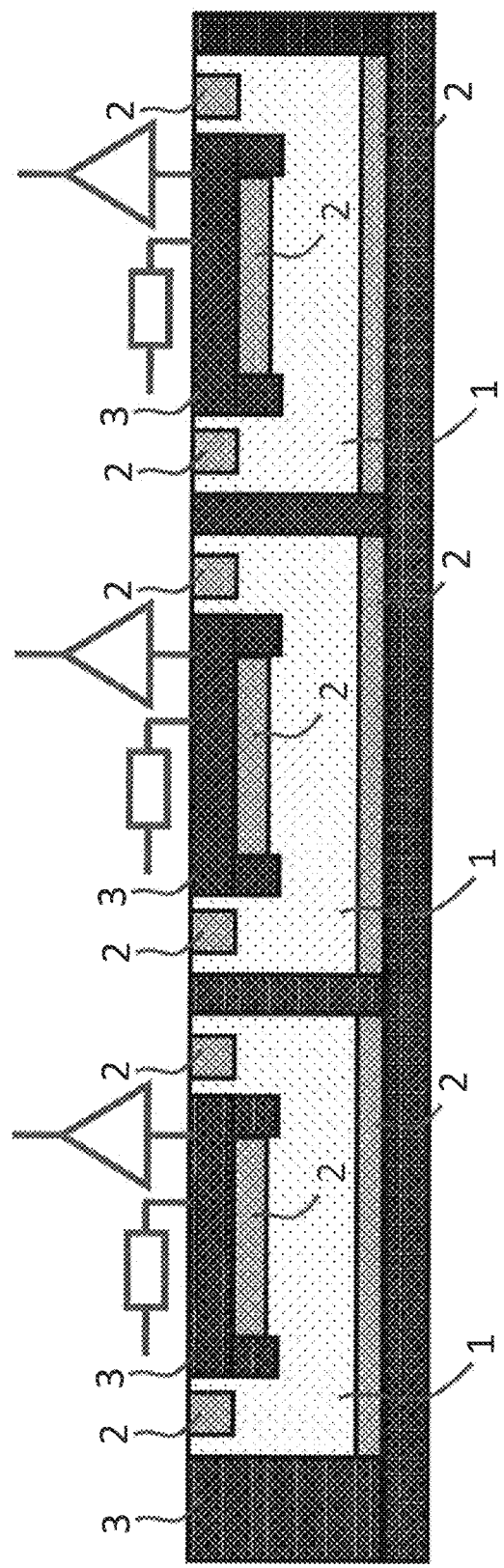

MULTI-JUNCTION PICO-AVALANCHE DETECTOR

TECHNICAL FIELD

The present invention relates to photon detector and more particularly to a high sensitivity single photon detector.

BACKGROUND OF THE ART

Existing semiconductors sensors comprise silicon p-substrate devices, which are the most common ones and which are possible to integrate with conventional microelectronic processes.

The simplest silicon detectors comprise PIN diodes and are called pixel sensors. This type of sensor is represented in FIGS. 1A-1C. It comprises a P region 1 (bulk), P+ regions 2 and N+ regions 3 acting as pixels. As shown in FIG. 1A, it is composed by an N-on-P diode matrix, but P-on-N or alternative solutions are also possible.

With this type of sensors, the bulk 1 of the sensor is depleted upon operation (detection). FIG. 1B shows that upon operation, the primary electrons e⁻ produced in the depletion region (bulk) drift to the anode, whereas the holes h⁺ drift to the cathode, thereby inducing a signal.

In these sensors, the pixel size is small and the depletion layer is wide, thus reducing the pixel capacitance and the electronic noise.

FIG. 1C shows a plot showing that the electric field is kept low while there is no multiplication mechanism in place in these sensors.

FIG. 2A to 2C describe conventional Avalanche Diode sensors comprising avalanche photo diodes (APD) 2, 3 instead of PIN diodes as above. The APD is a diode with a higher doping at the junction interface (PIPN), in order to increase the electric field locally and generate impact ionization.

The area between two pixels has no gain and is therefore considered inefficient. For this reason in an APD matrix the pixel size is typically large, limiting the space resolution and the performance of the front-end electronics, or the fill-factor is low, limiting the efficiency.

In FIG. 2B is represented an avalanche diode sensor upon operation (detection), in which thanks to the electron multiplying device which consists in the P+ region disposed on the N+ region, the electrons injected in the multiplication region start an avalanche, producing new electron/hole couples. The main contribution to the charge signal is induced by the secondary holes, represented by the bold arrow h⁺.

These secondary electrons are collected by the anode while the secondary holes drift back to the cathode. With this kind of sensor, the illumination can be from the top or from the Bottom. However, in the latter case the time resolution is worse. Also, all the electrons produced in the bulk generate avalanche multiplication, which leads to an excess noise of the device, limiting the performance of the Front-End electronics. Finally, as shown in FIG. 2C, with this sensor, in order to maintain a low sensor gain, the electric field must not exceed the breakdown voltage. The typical gain of an APD is in the range 10 to 1000.

FIGS. 3A to 3C show another type of existing sensors for single photon detection comprising arrays of Single Photons Avalanche Diodes (SPADs), also called Silicon Photo Multipliers (SiPM).

The SPAD is structurally similar to an APD where the depletion region is very thin, in order to minimize the probability of injection of a carrier produced by thermal generation. For this reason the SPAD is most sensitive to non-penetrating radiation FIG. 3B shows the operating of a SPAD sensor. More particularly, in a SPAD, the detection of a single primary charge carrier happens via Geiger discharge (above breakdown voltage). The breakdown is interrupted by the voltage drop on a bias element, called quenching resistor. After a short dead-time the SPAD is operative again The insulation between two SPADs is fundamental to minimize cross-talk and the risk of excess spurious counts All the electron/hole couples generated in the depletion region by thermal generation start a spurious count. The frequency of these counts is called Dark Noise Counting Rate (DNCR).

During the breakdown, photons can be generated from the electron-hole recombination. These photons are responsible for the optical cross-talk of the SiPM.

In order to minimize the DNCR, the depletion region of a SPAD is very shallow. This means that, despite a very small pixel size, its capacitance is very high due to the small thickness of the gain layer. Operating on large capacitance, the SPADs cannot integrate very low-noise electronics, which means that they are not able to discriminate the signal of a single photon if they are operated in proportional regime (gain<1000). The traditional approach is then to produce arrays of small pixels operated in Geiger regime (gain $10^6$-$10^7$), in which each pixel cannot distinguish the number of synchronous, primary incident photons. In Geiger regime, the gain regions must be independent for each pixel, in order to prevent the full sensor discharge. The separate gain regions generate critical field regions at the pixel borders, which may cause cross-talk, inefficiencies, loss of time resolution and early discharge.

Moreover, when integrating the electronics in the sensor surface, it will reduce the active gain area, thus reducing the active area (fill-factor) of the sensor. Finally, the Geiger regime does not allow the operation of the sensor in presence of strong light sources, as natural light illumination, due to the dead time associated to the pixel discharge.

An example of a conventional detector working in Geiger regime is made in U.S. Pat. No. 9,728,667 which shows a detector using a Geiger photodiode and a single P-N junction and presenting the drawbacks recited above.

FIG. 3C shows that the electric field in a SPAD is very high and limited to the junction region such that the gain of a SPAD is of the order of $10^6$.

Devices which operate in proportional regime and have a drift region, such as the Low-Gain Avalanche Diodes (LGAD) or some Avalanche Photo Diodes (APDs), integrate a gain Implant under the pixel, in the top surface of the device (similarly to what is done for the SPAD). These devices can operate with front-side illumination or back-side illumination. In the first case, the photoelectrons do not exploit the full gain layer, being injected from the side where the electron path is smaller. In the second case, the photoelectron drift in the substrate introduces time-jitter in the sensor response; the substrate thickness must therefore be minimized.

In this regard, a primary object of the invention is to solve the above-mentioned problems and more particularly to provide a single photon detector having an improved detection signal amplification with very low noise.

Another object of the invention it to provide a single photon detector with no pixel dead time A further object of the invention it to provide a single photon detector with uniform timing response with proper pixel design

SUMMARY OF THE INVENTION

The above problems are solved by the present invention which will be called PicoAD.

A first aspect of the invention is a multi-junction photon detector comprising a lightly p-doped or intrinsic silicon substrate presenting a drift region in the bulk, a plurality of N pixels on the top surface of the substrate, a P uniform doping implant on the backside of the substrate and at least one deep N implant layer on the backside, deeper in the substrate bulk than the P uniform doping implant, such that the detector presents a first PN junction in inverse polarization, corresponding to the interface between the N pixels and the drift region in the substrate, a second junction in direct polarization between the drift region and the deep N implant on the back side and a third PN junction in inverse polarization between the deep N implant and the substrate forming a gain region.

Preferably both the drift region and the deep N-gain implant are fully depleted, so that no current is injected through the corresponding forward-biased junction.

Advantageously, the third PN junction corresponds to a gain layer that covers uniformly the backside of the sensor active area.

Preferably, the third PN junction is operated at a field high enough to generate impact ionization from the charge carriers.

Advantageously, a region between the backside contact of the sensor and the gain layer is an absorption layer which can be modulated in thickness.

Preferably, the gain region comprises multiple fully depleted PN-junctions.

Preferably, the sensor is integrated with the electronics in a CMOS or a BiCMOS process.

Advantageously, the gain region is structured in impact layers and thermalisation layers thus increasing or decreasing the ratio between the electron and the hole multiplication gain in the multiplication region According to a preferred embodiment of the present invention, it further comprises electronegative elements favoring the capture or recombination of one type of carrier, i.e. the electrons or the holes, thus increasing or decreasing the ratio between the electron and the hole multiplication gain in the multiplication region.

Preferably, the pixel matrix area is surrounded by a guard ring structure. In this manner, one gradually increases the top-surface potential from the low voltage inside the guard ring to the same negative high voltage applied to the backside of the chip.

A second aspect of the invention is a multi-junction photon detector manufacturing method comprising a first step comprising a growth of a P-doped epi layer on a very low resistivity P+ silicon wafer, a second step of growing Gain N-layer on the P-doped epi layer, or alternatively the N-layer growth is replaced by ion implantation, and the whole is annealed, a third step consists in growing a P-doped epi-layer on top of the previous one, acting as substrate for the subsequent CMOS processing, a fourth step consisting in carrying out a CMOS processing, and a fifth step comprising thinning the total object by removing a major part of the wafer such that the total PicoAD thickness is approx. 40 µm.

Thanks to the above features, the present invention shows several advantages over the prior art sensors, among which:

1) It allows for the construction of small pixels with small capacitance, which result in small Equivalent Noise Charge and low values of the threshold on the integrated charge.
2) It provides a sensor with uniformity of response and very large efficiency also in the inter-pixel regions.
3) Only the electrons generated in the absorption layer on the backside of the sensor are multiplied. On the contrary, only the holes from electron-hole pairs produced in the drift region of the sensor are injected into the gain region. Since the gain for these carriers is low, a large enhancement of the prompt electron-component of the signal is produced and therefore providing an excellent timing performance.
4) It produces signal waveforms with onset in the region where the weighting field, which determines the signal induction on the pixels, is most uniform.
5) It is compatible with CMOS structures, thus allowing for a monolithic implementation.

All the limitations of the SiPM are removed in the sensor of the present invention since the proportional gain layer on the backside can be uniform and common for the whole sensor region, while the top surface can be fully processed without any loss of sensor fill factor.

The proposed sensor, having the gain layer on the backside, immediately multiplies the photo-electron in the case of backside illumination, without producing time jitter. The photoelectron, in contrast with front side illuminated APD, traverses the full gain-layer. Finally, the electrons produced by thermal agitation in the thick drift region do not drift through the gain layer, so the extra noise factor is very low compared with the LGAD structure.

To summarize, the new proposed structure of the sensor of the present invention shows the following advantages. Thanks to the proportional operation of the pixel, the sensor provides an analogue in-pixel photon counting, a zero dark-noise counting rate, a stable working point with respect to temperature and voltage variations, no pixel dead time, a sensor operation with natural light illumination and no optical cross talk. Furthermore, thanks to the uniform gain layer, the sensor can provide close to 100% fill-factor while integrating the electronics in the sensor ASIC, no critical inter-pixel regions and a uniform timing response with proper pixel design. Finally, thanks to the separate drift region and the PNPN structure, the sensor provides a low pixel capacitance (low electronics noise), a dominating electron gain and drift (faster response) and only the few primary charges produced by thermal agitation in the very thin gain layer are multiplied (low excess noise factor).

Also, the principle of introducing separate junctions inside the substrate can be extended to a larger number of junctions: a multi-stage gain is possible with a NPNPNP . . . structure. The advantage in this case could be a reduced non-uniformity of the gain due to process mismatch.

The concept, described for p-substrate CMOS process, can be extended to n-substrate process or to other semiconductor technologies (such as GaAs, InGaAs, Diamond, etc.). Lower bandgap technologies could allow operating at a lower voltage and with larger photo-detection efficiencies in the IR band compared to silicon technology.

Despite the possibility to integrate the electronics is a big advantage of this invention, it is not strictly required and the innovation of the NPNP sensor structure (not diode) would still hold.

The device, originally designed for light, could be used with ionizing particles, granting exceptional time resolution compared with any existing pixel detector technology, thanks to the very small active area for the signal gain.

BRIEF DESCRIPTION OF THE DRAWINGS

Further particular advantages and features of the invention will become more apparent from the following non-limitative description of at least one embodiment of the invention which will refer to the accompanying drawings, wherein FIGS. 1A to 1C represent a conventional PIN sensor, its functioning upon detection and an electrical field vs depth plot;

FIGS. 3A to 3C represent a conventional SPAD sensor, its functioning upon detection and an electrical field vs depth plot;

Figure 4A:
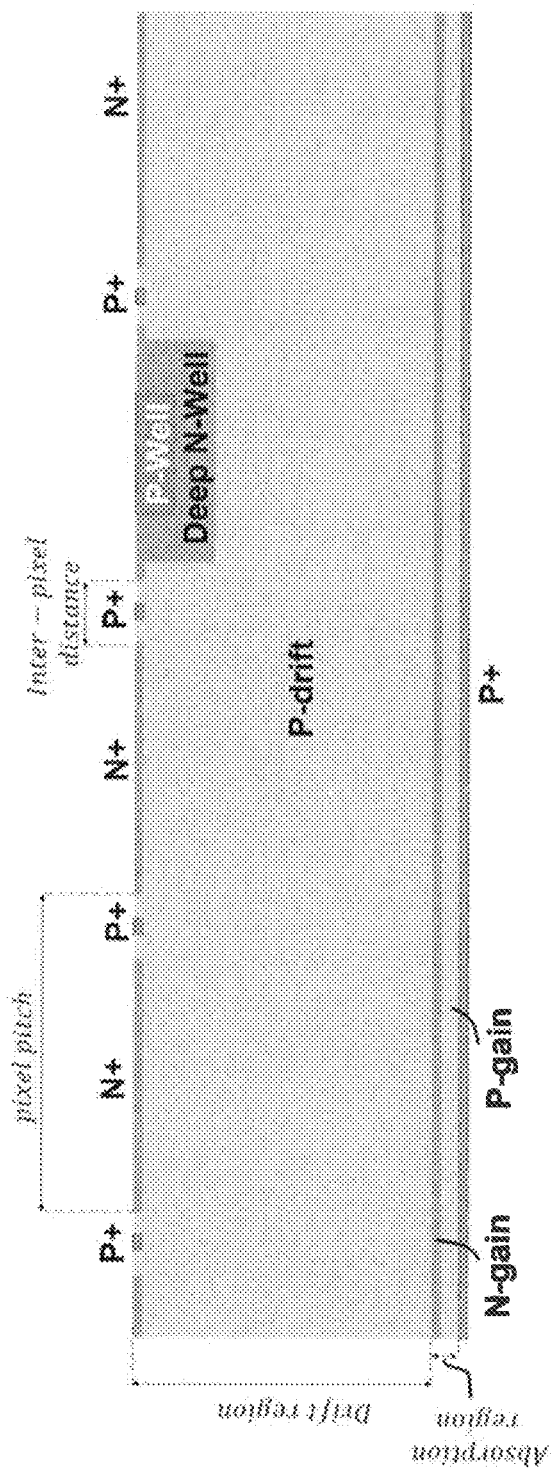
Figure 4B:
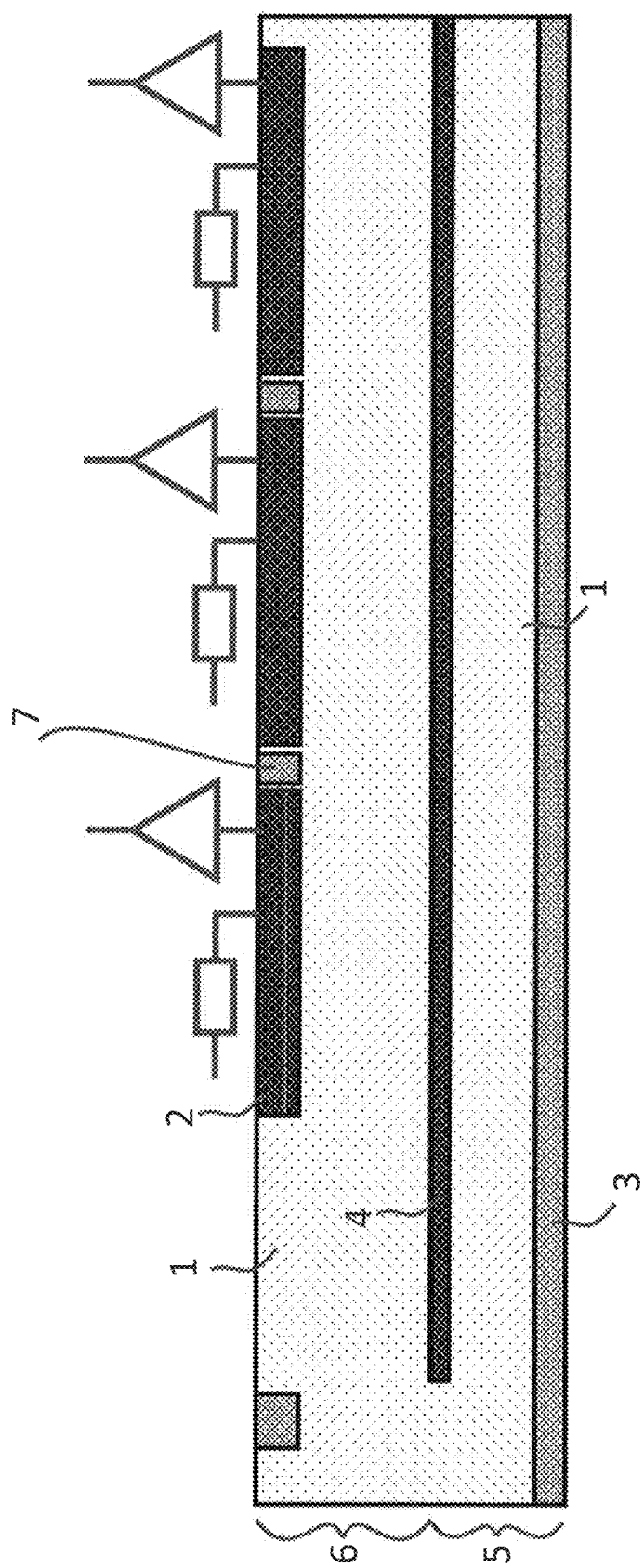
Figure 4C:
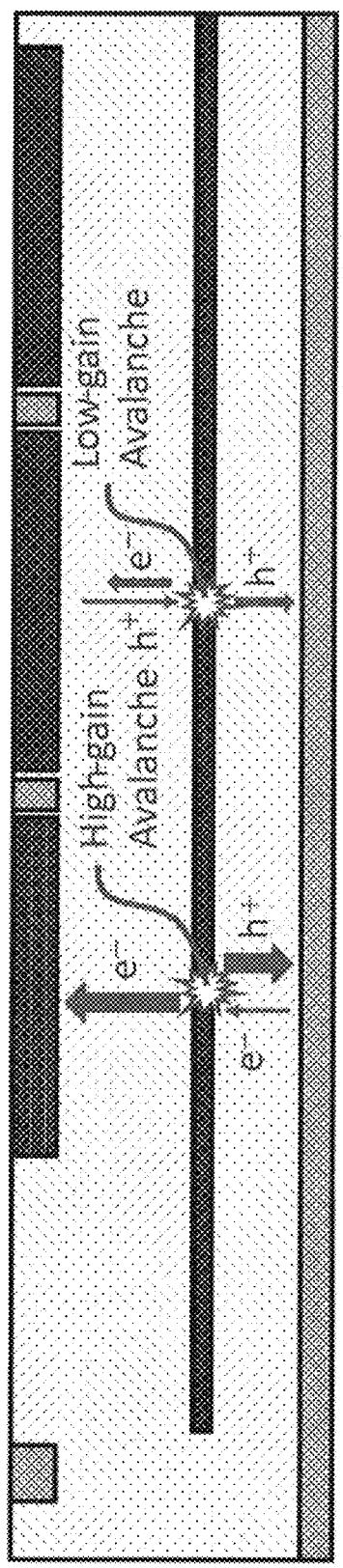

The FIG. 4A to 4C show a first aspect of the invention which is a section of a sensor according to the present invention, showing at the top N+ pixels interleaved by P-stops which are preferred but non fundamental, and a deep N-well that will host the electronics. The PN gain junction is placed in the opposite side of the P-drift region with respect to the pixels.

Figure 4D:
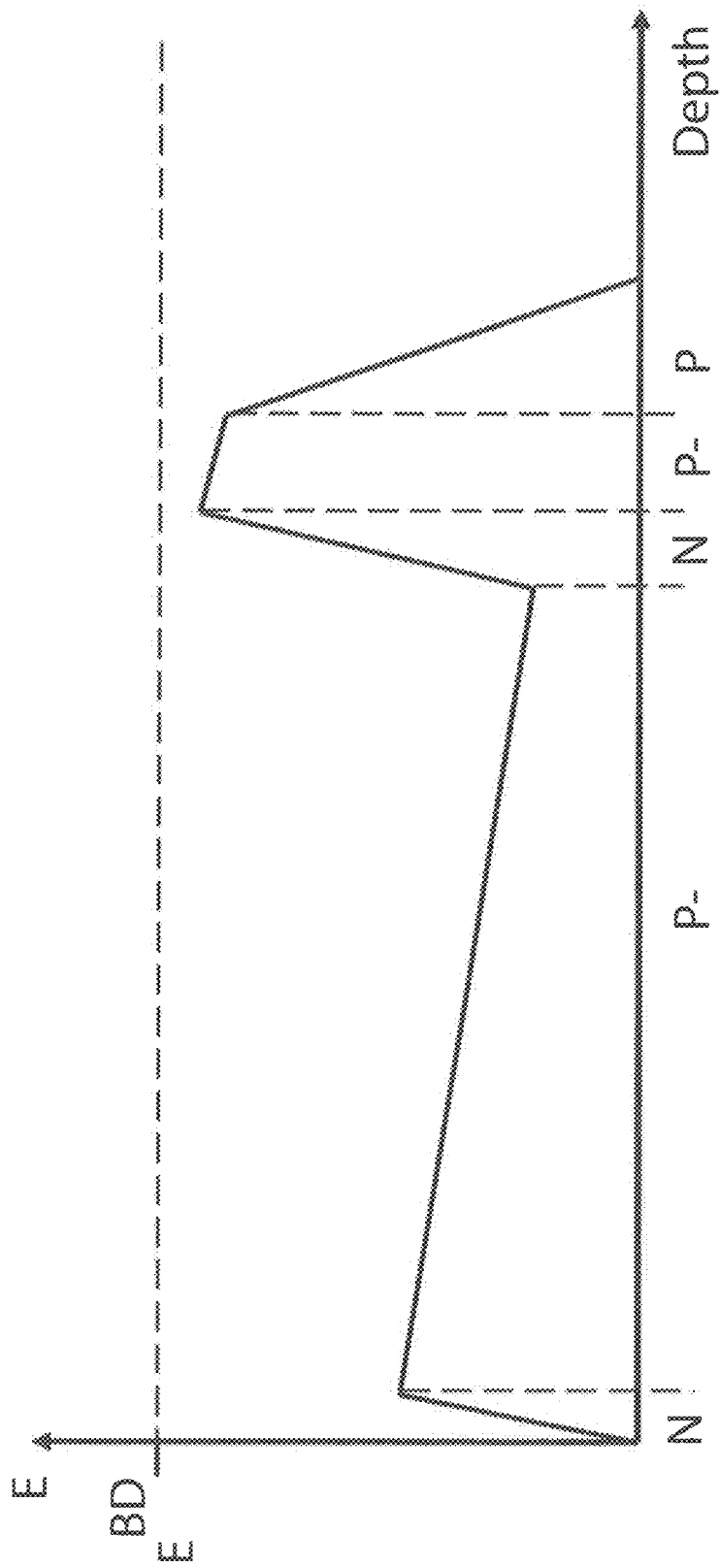

The FIG. 4D shows the Electric field in the gain (left) and in the drift (right) regions. The example is given in the case of two PN-gain junctions and one PN-drift junction. The gain in the multi-junction pico-avalanche detector is in the range 10-1000 and the sensor is operated in linear avalanche region.

Figure 5:
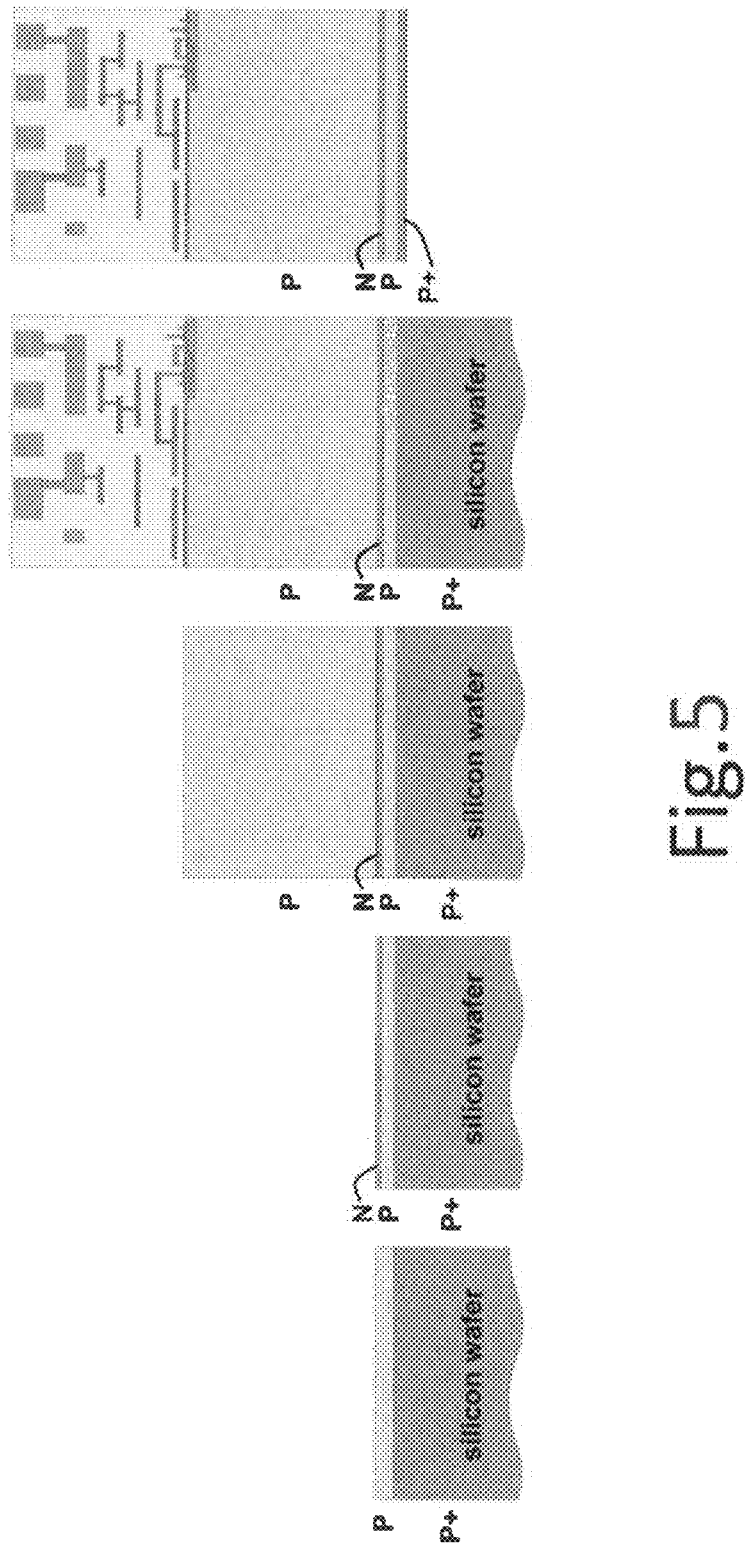

The FIG. 5 shows the manufacturing process of the sensor of the present invention.

DETAILED DESCRIPTION OF THE INVENTION

The present detailed description is intended to illustrate the invention in a non-limitative manner since any feature of an embodiment may be combined with any other feature of a different embodiment in an advantageous manner.

The sensor of the present invention is illustrated in FIGS. 4A and 4B.

The sensor structure, which is not a diode, is composed by a lightly p-doped silicon substrate 1, n+ pixels 2 on the top surface and p+ uniform 3 doping on the backside. An additional n-doped, uniform layer 4 is present on the backside, deeper in the bulk than the p+ implant 3, in order to generate a gain region. Therefore, the doping structure of the sensor, from top to bottom, is NPNP. Between the pixel and the gain layer is provided a drift region 6. The inter-pixel p+ implant 7 is optional.

With this structure, the detector presents the n+ pixels 2 and p+ uniform doped region 3 as end terminals of the current such that upon detection the current signal generated goes through the drift region 1 and the additional n-doped, uniform layer 4.

The top surface can be fully processed with a microelectronic process such as bias components and electronic devices. The bottom surface presents only uniform implantation or growth and metal depositions. The pixels on the top surface, i.e. the n+ zones, are operated at low, positive voltage, while the backside p+ implant is referred to negative high-voltage.

As shown in FIG. 4C, the sensor is meant to operate after fully depleting both the n+/p junctions between the pixels and the substrate and the n/p+ junction on the backside. Once depleted, the space charge density of the n-doped region in the n/p+ junction is higher compared to the p-substrate, thus creating a very high electric field region on the backside (gain region) and a low-field region in the substrate (drift region). The high field region, or gain region, has sufficiently high electric field to generate electron avalanche-multiplication. The full depletion of the p substrate grants the pixel-to-pixel insulation. The sensor is illuminated from the backside, so that the conversion of primary photons injects electrons in the gain region. These electrons incur in avalanche multiplication, generating the secondary electron/hole pairs. The secondary electrons drift for several microns in the drift region, generating the signal on the corresponding pixel by capacitive coupling, while the secondary holes drift back for few hundreds of nanometers, their path being so short that almost no signal is induced. In the case of illumination with longer wavelength light, a thicker absorption region can be placed between the gain region and the backside p+ contact, just by increasing the thickness of the p-doped layer forming the gain junction The signal induced on the pixels is amplified and processed by means of the electronics, which can be integrated in the top surface of the sensor. The gain junction is meant to operate in proportional regime, in contrast with the conventional single-photon avalanche diodes which require to operate in Geiger regime in order to discriminate the single photon signal.

Preferably, the sensor is integrated with the electronics in a CMOS or a BiCMOS process and optimized for single photons detection The PNPN (or in general multi-junction) structure grants the sensor with stable operation as the diode, but in addition allows engineering the gain and drift regions.

In other words, the Multi-Junction Pico-Avalanche Detector (MJAD or PicoAD) of the present invention is a silicon sensor with a pixelated, fully depleted $(PN)_{DRIFT}(PN)_{GAIN}$ structure.

The first inversely polarized PN junction constitutes the drift and signal induction region, with the N-pixels on a P-substrate (in alternative: P-pixels on N-substrate, P-pixels on P substrate, N-pixels on N substrate) operated at a field of approximately 2 V/µm to saturate the electron drift velocity and minimize the amplified signal rise time, thus minimizing the electronics contribution to time resolution (in general, the electric field in the drift region is low enough in order to avoid the generation of an avalanche effect).

The other inversely polarized PN junction corresponds to the gain layer that covers uniformly (or with reasonable variations in order to generate uniform gain in the layer itself) the backside of the sensor active area inside a guard ring and is operated at a field high enough to generate impact ionization from the charge carriers. The region between the backside contact of the sensor and the gain layer is the absorption layer and it can be modulated in thickness.

The gain layer is operated below the breakdown voltage and the sensor is not meant to be used in Geiger regime. Profiting of the low-noise of the electronics offered by the low-capacitance design, the sensor can have sufficient sensitivity to detect single photons while operating in proportional regime.

When a negative high voltage is applied to the backside of the sensor, while keeping the pixels at positive low voltage, the depletion of the gain layer goes downwards from the N-gain to the bottom P+ contact. Once the gain layer is depleted, the direct junction between the N-gain and the P-drift substrate transfers the high voltage to the substrate itself, starting the normal depletion of the sensor, which goes downwards from the pixels (the depletion can start from the top junction and then move to the bottom one, but the final result is the same).

This second depletion ensures the proper insulation of the pixels, as for a traditional N-on-P detector. The full depletion is achieved when the two depletion layers are in contact. At this point, the top and the bottom reverse-biased junctions will prevent the current injection from the terminals in the device. Further increase of the high voltage allows setting of the gain of the multiplication region. The electric field is as uniform as possible for a given depth of the sensor active area. In order to improve the uniformity, the pixels are wider than the sensor thickness and the inter-pixel spacing is minimized. The drift region is also deep in comparison to the inter-pixel spacing to minimize the local variations of the electric field. The gain implantations, which are typically uniform under the pixel area, can be adjusted in the inter-pixel region to increase the uniformity of the gain region.

The active area (i.e. the area where the pixel matrix is located) is surrounded by a guard ring structure, which gradually increases the top-surface potential from the low voltage inside the guard ring to the same negative high voltage applied to the backside of the chip. In alternative, a positive high voltage can be applied to the pixel. The N implantations of the gain layer do not extend far outside the area underneath the guard ring, in order to avoid charge injection from the chip edge.

In its preferable implementation, the sensor is integrated in a CMOS process as shown in FIG. 5. In a more preferable implementation, the sensor is integrated in a SiGe BiCMOS process and the signal amplification is made by using SiGe HBT transistors. In the N-on-P pixel configuration, the electronics is placed inside deep N-wells (These N-wells can be independent or they can be the same implants used for the pixel formation) in order to insulate it form the high-voltage. Each pixel has its own amplifier and, in the preferred configuration, the coincidence between different pixels is done at digital level by counting the number of pixels firing at the same time. This approach allows to maintain a small capacitance at the input of the amplifier, thus extending the sensitivity to smaller input signals. The integration with a CMOS processing would also allow a real-time control of the potential on the single pixels in order to compensate gain variations along the detector surface. This, together with the uniform electric field configuration, would allow for a higher average gain achievable in the sensor.

Figure 1B:
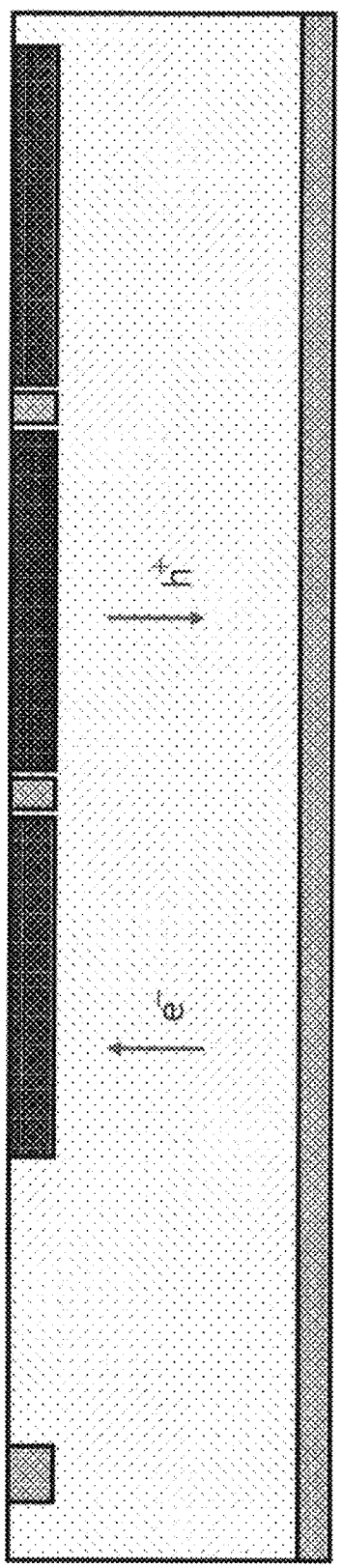
Figure 1C:
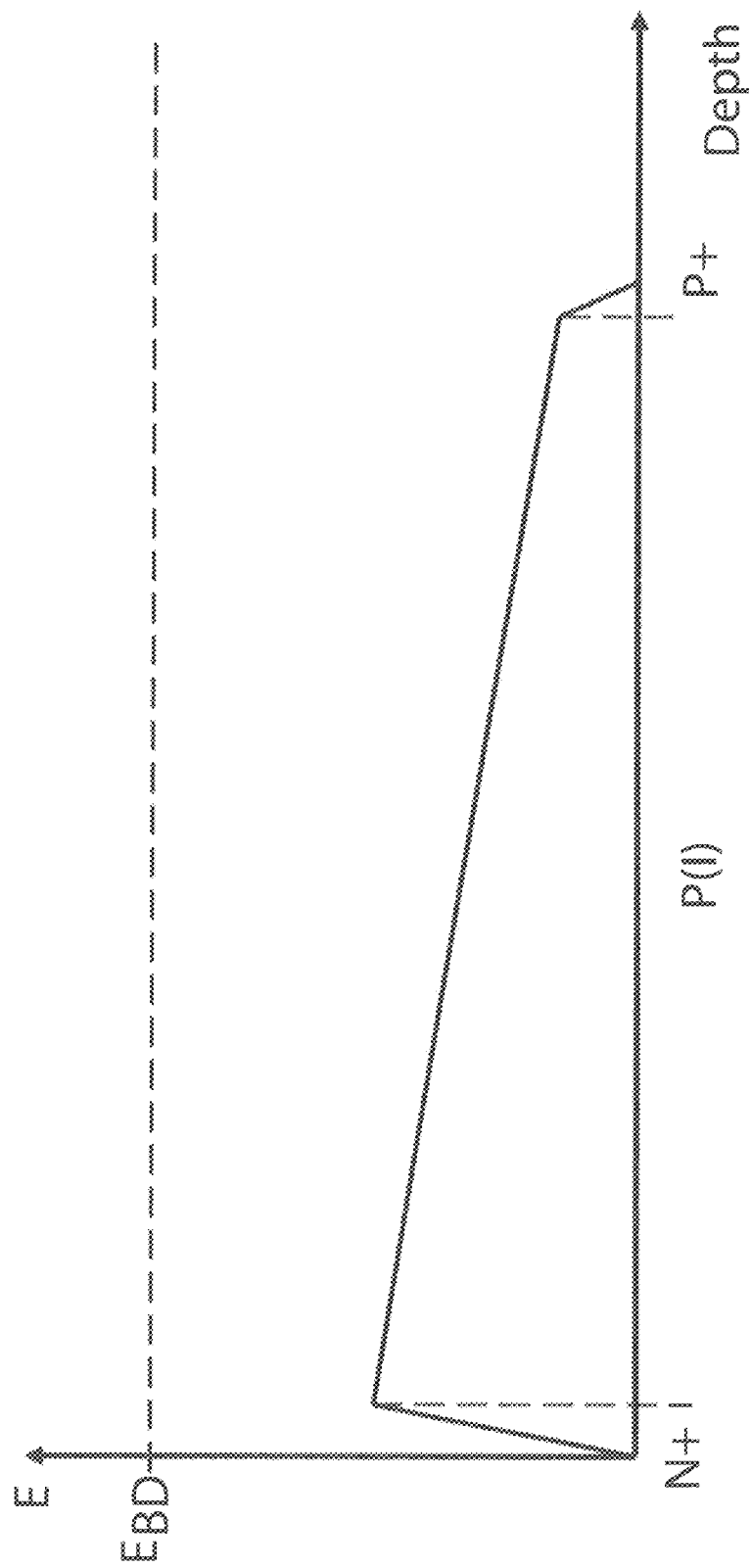
Figure 2A:
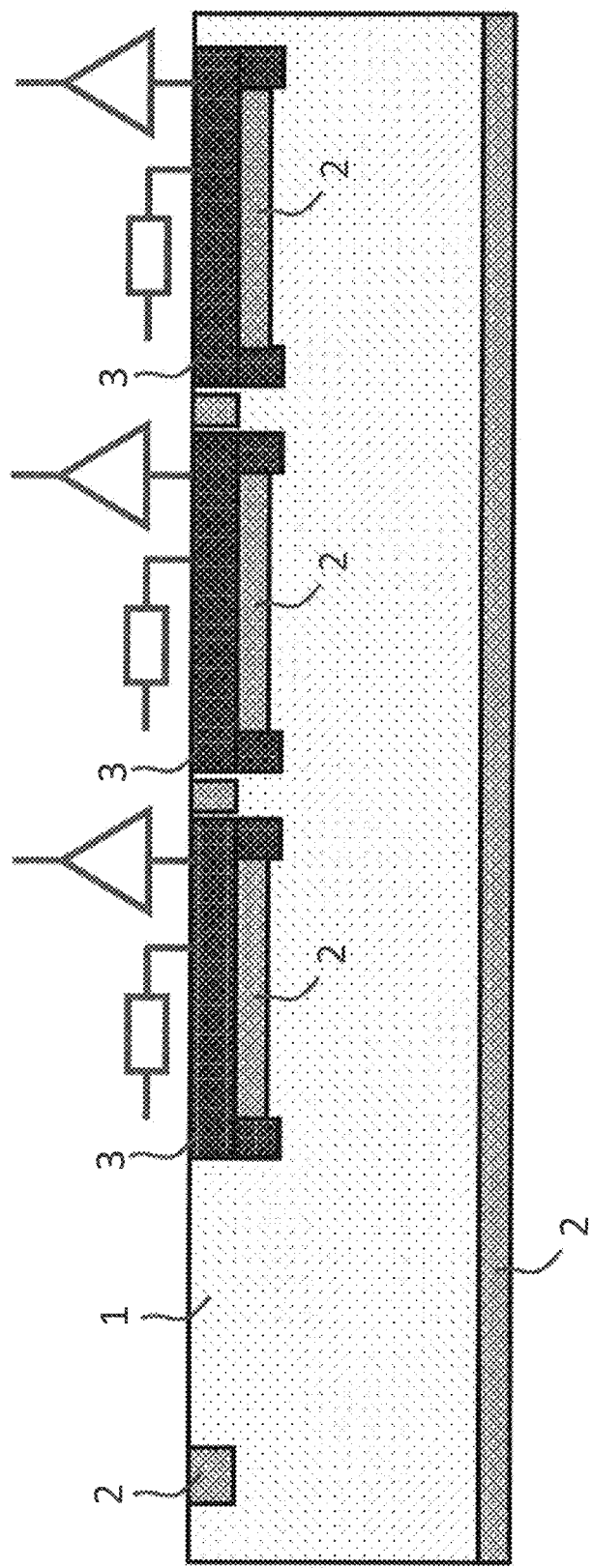
FIGS. 2A to 2C represent a conventional APD sensor, its functioning upon detection and an electrical field vs depth plot.
Figure 2B:
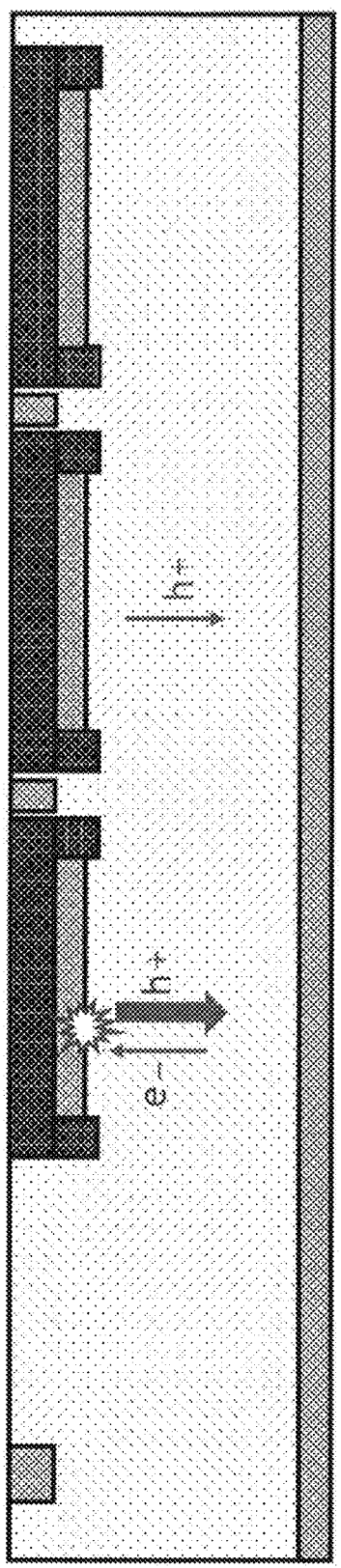
Figure 2C:
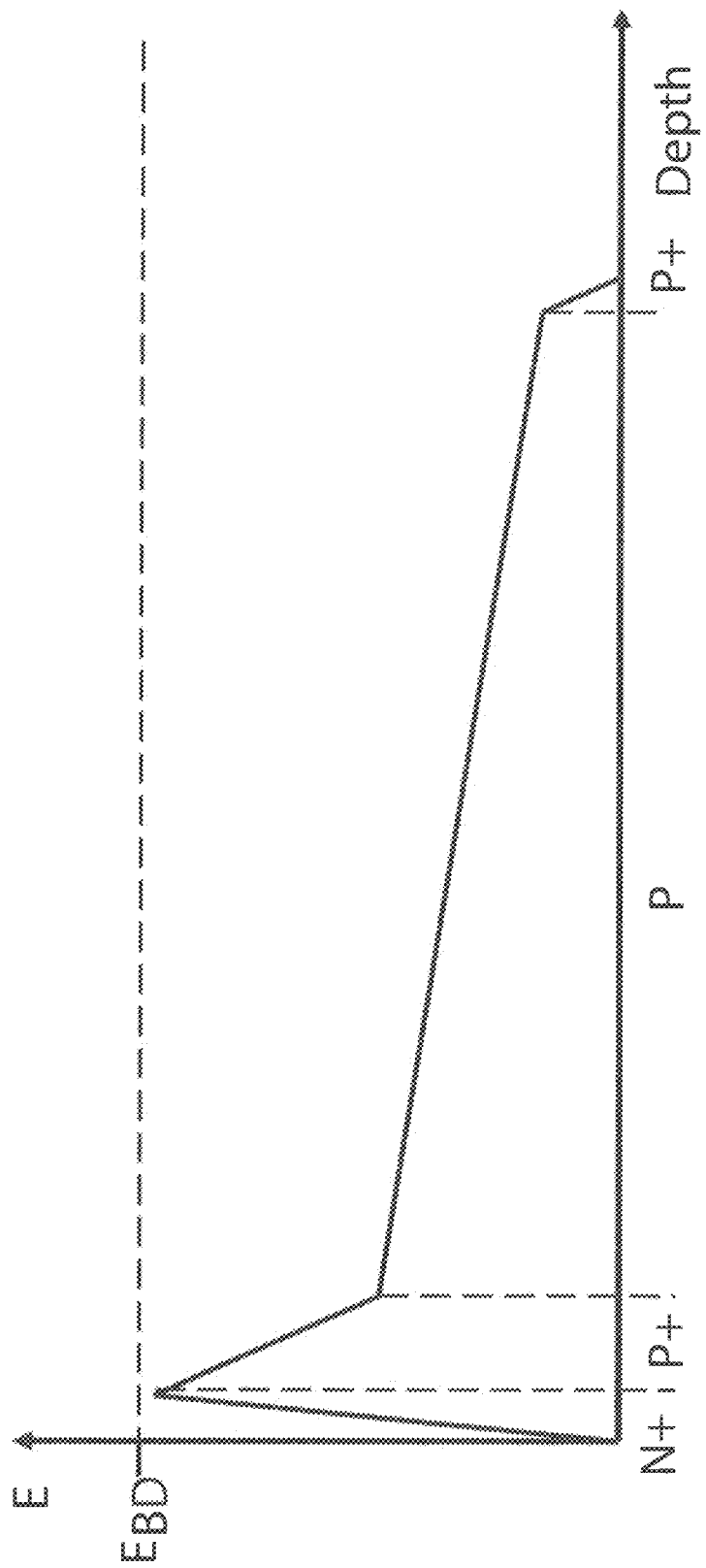
Figure 3B:
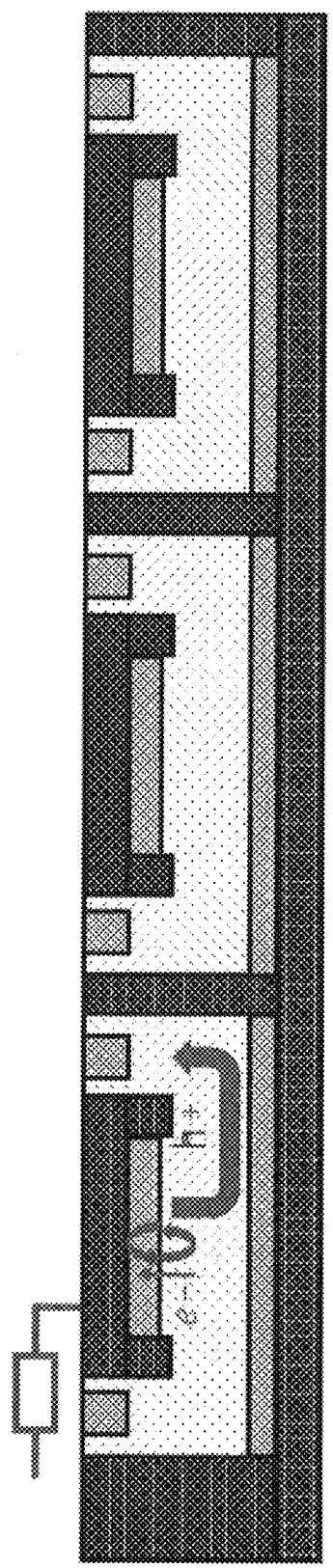
Figure 3C:
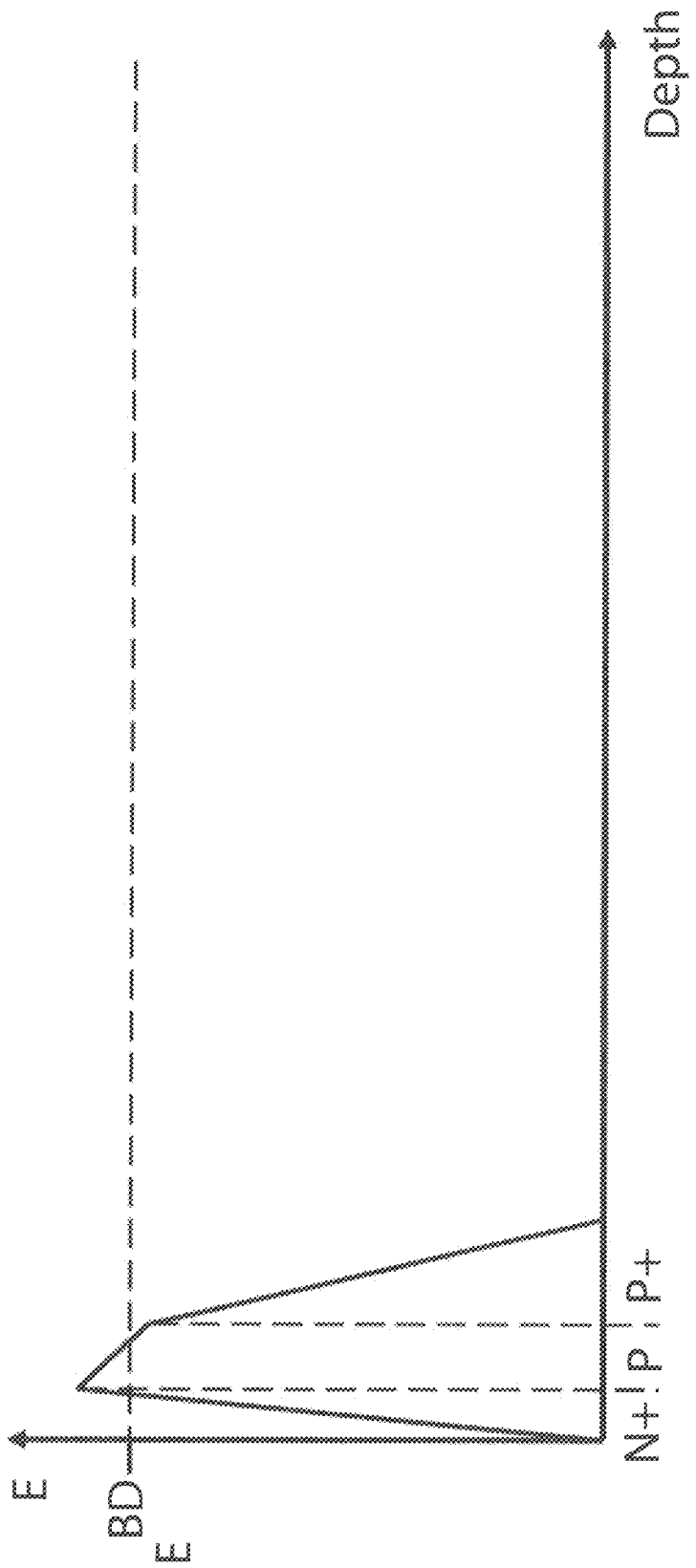

In a more general configuration, the gain region is made of several PN junctions in series in a multi-step configuration. This allows to control the electric field more precisely (FIG. 2, an example with two PN junctions in the gain region). The gain junctions can be structured in a way that the electric field is very intense in very thin layers (impact layers), with regions with a lower field in between (thermalisation layers). This will allow to exploit the non-local impact gain multiplication mechanisms, which could be used to increase the maximum internal gain while keeping a low the excess noise of the sensor.

The possibility to use hetero-structures in the multi-step gain region, either for the impact layers or for the for the thermalisation layers, allows further increase of the maximum achievable gain at low noise. In particular, for a silicon substrate the main candidate materials are Silicon-Germanium for the impact layers and Silicon-Carbide for the thermalisation layers.

The PicoAD can be implemented in different semiconductor materials, as GaAs, InP, Ge, and the like The present invention also refers to a sensor fabrication method which is shown in FIG. 6 which shows the five steps of the procedure to manufacture the PicoAD. According to the manufacturing method of the present invention, a first step comprises a growth of approx. 1 μm of a P-doped epi layer on a very low resistivity wafer. Then, in a second step one implant a Gain N-layer and the whole is annealed. The third step consists in growing a wider P-doped epi-layer (for example 19 μm). Then in step 4, a CMOS processing is carried out (approx. 18 μm). Finally, step 5 comprises thinning the total object by excising the major part of the wafer such that the total PicoAD is approx. 40 μm.

Through this fabrication process, one can vary the thickness of the different layers. By varying the thickness of the absorption layer and the material, the PicoAD can be used for detection of ionizing radiation, X-Rays, γ-Rays and light in the spectrum ranging from the Infra-Red to the Ultra-Violet. The PicoAD structure is preferably optimized for timing measurement with photons, for high-sensitivity and possibility of high gain.

While the embodiments have been described in conjunction with a number of embodiments, it is evident that many alternatives, modifications and variations would be or are apparent to those of ordinary skill in the applicable arts. Accordingly, this disclosure is intended to embrace all such alternatives, modifications, equivalents and variations that are within the scope of this disclosure. This for example particularly the case regarding the different apparatuses which can be used.

The invention claimed is:

1. Multi-junction photon detector comprising
   a silicon substrate presenting a drift region in the bulk (1),
   a plurality of pixels (2) on the top surface of the silicon substrate,
   a uniform doping implant (3) on the backside surface of the substrate and
   at least one deep implant layer (4) on the backside, deeper in the substrate bulk than the uniform doping implant such that the drift region (1) and the deep implant layer (4) are interposed between the plurality of pixels (2) and the uniform doping implant (3),
   wherein, in use, the detector presents a first junction in inverse polarization, corresponding to the interface between the pixels (2) and the drift region in the substrate (1), and
   a second PN junction in inverse polarization between the deep implant layer (4) and the uniform doping implant (3) on the backside surface forming a gain region,
   wherein both the plurality of pixels (2) and the uniform doping implant (3) function as end terminals, generating a current signal between them and directing said current signal through the drift region (1) and the deep implant layer (4) responsive to photons at the pixels.

2. Multi-junction photon detector according to claim 1, characterized in that the first junction is a PN junction in inverse polarization where the silicon substrate is a lightly p-doped or intrinsic silicon substrate and the pixels are n-doped.

3. Multi-junction photon detector according to claim 1, characterized in that the second junction is a PN junction in inverse polarization formed between a deep n-doped layer (4) and a uniform p+ doped region (3) in the backside surface of the substrate.

4. Multi-junction photon detector according to claim 1, characterized in that it comprises a third junction in direct polarization between the drift region and the deep n-doped implant layer on the back side.

5. Multi-junction photon detector according to claim 1, characterized in that the second PN junction in inverse polarization corresponds to a gain layer that covers uniformly the backside of the sensor active area.

6. Multi-junction photon detector according to claim 1, characterized in that the second PN junction in inverse polarization is operated at a field high enough to generate impact ionization from the charge carriers.

7. Multi-junction photon detector according to claim 1, characterized in that a region between the backside contact of the sensor and the gain layer is a photon absorption layer which can be modulated in thickness.

8. Multi-junction photon detector according to claim 1, characterized in that it comprises multiple PN-junctions in the gain region.

9. Multi-junction photon detector according to any one of claim 1, characterized in that the pixel matrix is surrounded by a guard ring structure.

10. Multi-junction photon detector according to claim 1, characterized in that it is integrated with the electronics in a CMOS or a BiCMOS process.

11. Multi-junction photon detector according to claim 1, characterized in that it is integrated with the electronics in a SiGe BiCMOS process.

12. Multi-junction photon detector according to claim 1, characterized in that the gain region is structured in impact layers and thermalisation layers.

\* \* \* \* \*